(12) United States Patent
Tran et al.

(10) Patent No.: US 7,563,625 B2
(45) Date of Patent: Jul. 21, 2009

(54) METHOD OF MAKING LIGHT-EMITTING DIODES (LEDS) WITH IMPROVED LIGHT EXTRACTION BY ROUGHENING

(75) Inventors: Chuong Anh Tran, Baoshan Township, Hsinchu County (TW); Trung Tri Doan, Baoshan Township (TW); Chen-Fu Chu, Hsinchu (TW); Hao-Chun Cheng, Donggang Township, Pingtung County (TW); Feng-Hsu Fan, Jhonghe (TW)

(73) Assignee: SemiLEDs Optoelectronics Co., Ltd., Chu-Nan (TW)

( * ) Notice: Subject to any disclaimer, the term of this patent is extended or adjusted under 35 U.S.C. 154(b) by 63 days.

(21) Appl. No.: 11/618,468

(22) Filed: Dec. 29, 2006

(65) Prior Publication Data

US 2007/0166851 A1    Jul. 19, 2007

Related U.S. Application Data

(63) Continuation-in-part of application No. 11/032,880, filed on Jan. 11, 2005, now Pat. No. 7,186,580.

(51) Int. Cl.
*H01L 21/00* (2006.01)
(52) U.S. Cl. .............................. 438/29; 438/22; 438/48; 438/E21.216
(58) Field of Classification Search ................... 438/29, 438/42
See application file for complete search history.

(56) References Cited

U.S. PATENT DOCUMENTS

| 3,954,534 | A |   | 5/1976  | Scifres et al. |
| 4,482,442 | A |   | 11/1984 | Kohl et al. |
| 5,448,107 | A |   | 9/1995  | Osada et al. |
| 5,779,924 | A | * | 7/1998  | Krames et al. ................ 216/24 |
| 5,793,062 | A |   | 8/1998  | Kish, Jr. et al. |
| 5,801,404 | A |   | 9/1998  | Kahen et al. |
| 6,023,413 | A |   | 2/2000  | Umezawa |
| 6,071,795 | A |   | 6/2000  | Cheung et al. |
| 6,161,910 | A |   | 12/2000 | Reisenauer et al. |
| 6,221,683 | B1 |  | 4/2001  | Nirschl et al. |
| 6,277,665 | B1 |  | 8/2001  | Ma et al. |
| 6,429,460 | B1 |  | 8/2002  | Chen et al. |
| 6,455,930 | B1 |  | 9/2002  | Palanisamy et al. |
| 6,535,385 | B2 |  | 3/2003  | Lee |

(Continued)

OTHER PUBLICATIONS

I. Schnitzer et al., "30% external quantum efficiency from surface textured, thin-film light-emitting diodes," Appl. Phys. Lett. Oct. 1993 vol. 63(16): pp. 2174-2176.

(Continued)

*Primary Examiner*—Dung A. Le
(74) *Attorney, Agent, or Firm*—Patterson & Sheridan, LLP

(57) ABSTRACT

Methods for fabricating a semiconductor light-emitting diode (LED) device with increased light extraction are provided. The method generally includes applying a mask to a surface of an LED wafer, etching the surface of the LED wafer such that etched pits are formed in the surface, removing the mask, and roughening or texturing the surface of the LED wafer including the etched pits. In this manner, the surface area of the LED device may be increased when compared to a conventional LED device, and less emitted light may experience total internal reflection (TIR) according to Snell's law, thereby leading to increased light extraction.

20 Claims, 15 Drawing Sheets

U.S. PATENT DOCUMENTS

| | | | |
|---|---|---|---|
| 6,561,261 B2 | 5/2003 | Wagner |
| 6,614,172 B2 | 9/2003 | Chiu et al. |
| 6,649,440 B1 | 11/2003 | Krames et al. |
| 6,658,041 B2 | 12/2003 | Uebbing |
| 6,713,862 B2 | 3/2004 | Palanisamy et al. |
| 6,744,071 B2 | 6/2004 | Sano et al. |
| 6,770,542 B2 | 8/2004 | Plössl et al. |
| 6,800,500 B2 | 10/2004 | Coman et al. |
| 6,821,804 B2 | 11/2004 | Thibeault et al. |
| 6,828,529 B1 | 12/2004 | Wu |
| 7,123,796 B2 | 10/2006 | Steckl et al. |
| 2002/0097962 A1 | 7/2002 | Yoshimura et al. |
| 2003/0178626 A1 | 9/2003 | Sugiyama et al. |
| 2004/0134788 A1 | 7/2004 | Cohen et al. |
| 2004/0135158 A1 | 7/2004 | Hon |
| 2004/0245535 A1 | 12/2004 | D'Evelyn et al. |
| 2004/0245543 A1 | 12/2004 | Yoo |
| 2006/0091409 A1* | 5/2006 | Epler et al. ............. 257/95 |
| 2006/0154391 A1 | 7/2006 | Tran et al. |
| 2007/0037307 A1* | 2/2007 | Donofrio .................. 438/42 |

OTHER PUBLICATIONS

A Köck et al., "Strongly Directional Emission from AlGaAs/GaAs Light-Emitting Diodes," Appl. Phys. Lett. Nov. 1990 vol. 57: pp. 2327-2329.

PCT International Search Report dated May 22, 2008.

PCT International Search Report dated Jun. 2, 2008.

Lee et al., "Effect of electrical annealing on the luminous efficiency of thermally annealed polymer light-emitting diodes," Appl. Phys. Lett., Nov. 2000 vol. 77(21): Abstract.

* cited by examiner

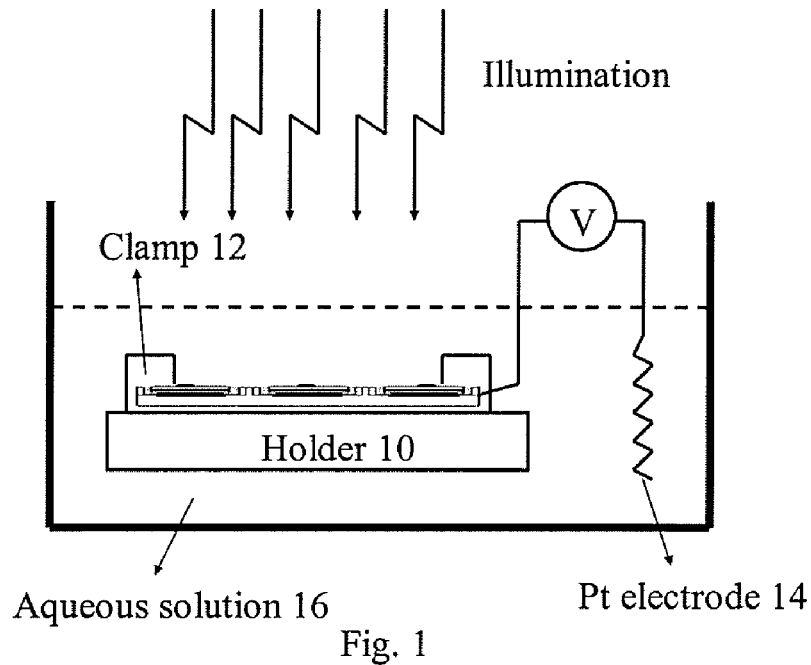
Fig. 1
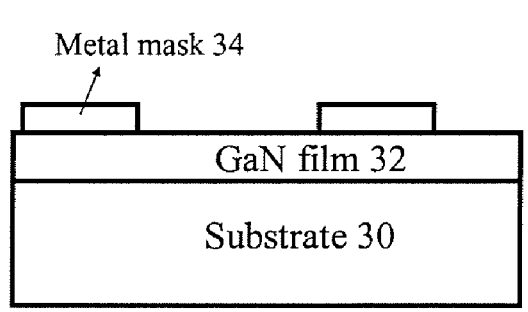
Fig. 2A
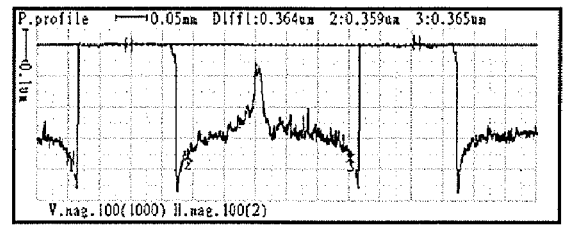
Fig. 2C, 400sec
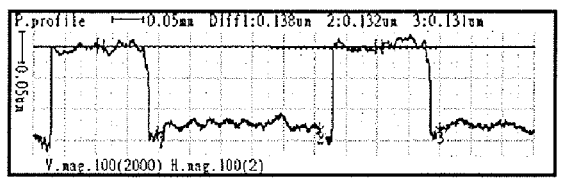
Fig. 2B, 200sec
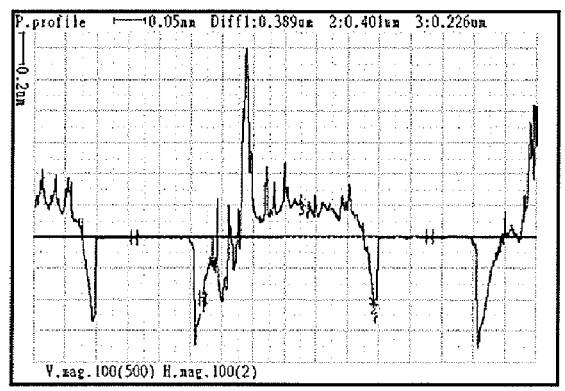
Fig. 2D, 600sec

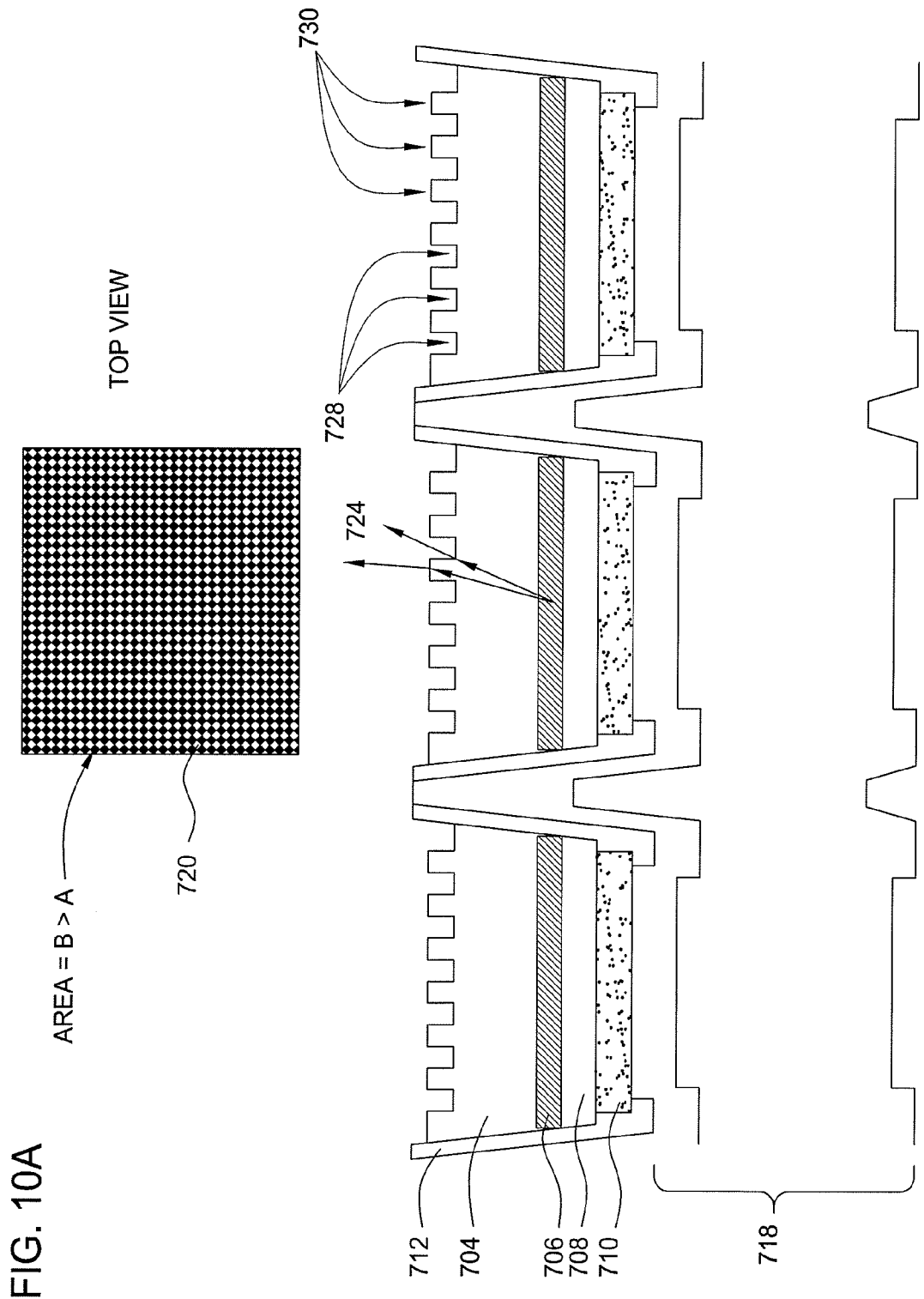

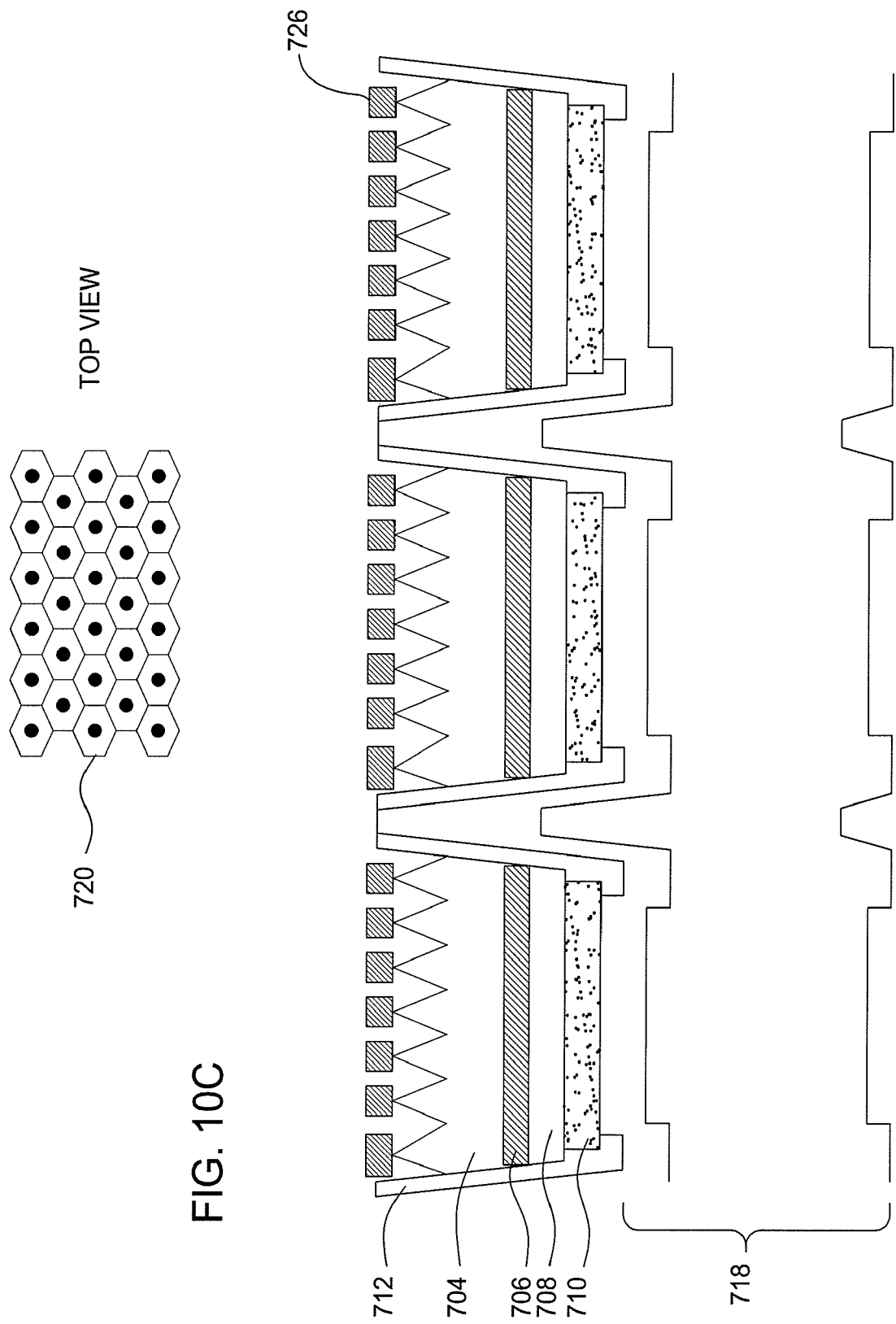

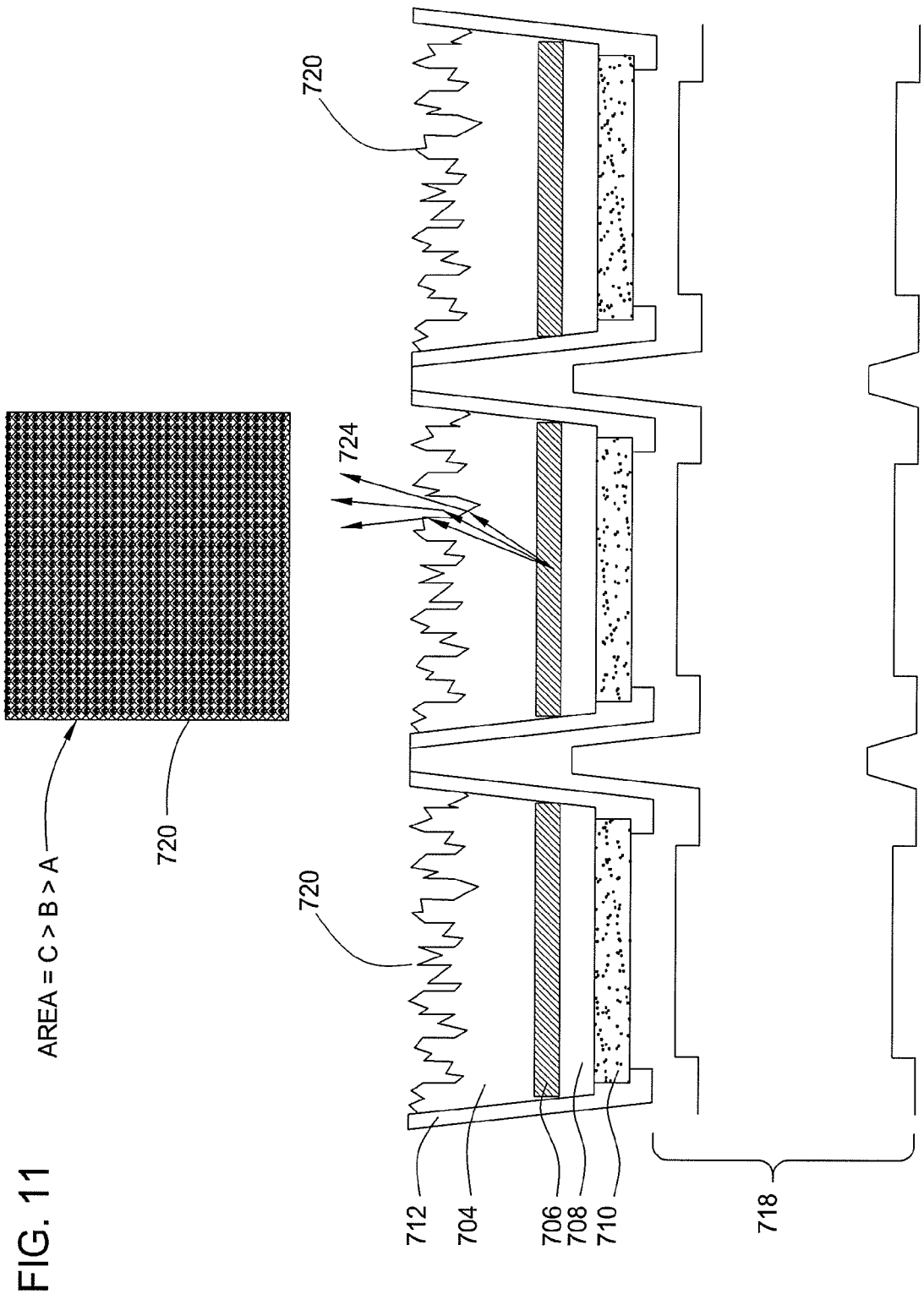

METHOD OF MAKING LIGHT-EMITTING DIODES (LEDS) WITH IMPROVED LIGHT EXTRACTION BY ROUGHENING

CROSS-REFERENCE TO RELATED APPLICATION

This application is a continuation-in-part of U.S. application Ser. No. 11/032,880 filed Jan. 11, 2005, now U.S. Pat. No. 7,186,580 which is herein incorporated by reference.

BACKGROUND

This invention relates to light emitting diodes and more particularly to new LED structures for enhancing their light extraction.

Light emitting diodes (LEDs) are an important class of solid state devices that convert electric energy to light. LEDs typically provide an active layer of semiconductor material sandwiched between two oppositely doped layers. When a bias is applied across the doped layers, holes and electrons are injected into the active layer where they recombine to generate light. The light generated by the active region emits in all directions and light escapes the semiconductor chip through all exposed surfaces.

As semiconductor materials have improved, the efficiency of semiconductor devices has also improved. New LEDs are being made from materials such as InAlGaN, which allows for efficient illumination in the ultraviolet to amber spectrum. Many of the new LEDs are more efficient at converting electrical energy to light compared to conventional lights and they can be more reliable. As LEDs improve, they are expected to replace conventional lights in many applications such as traffic signals, outdoor and indoor displays, automobile headlights and taillights, conventional indoor lighting, etc.

The efficiency of conventional LEDs is limited by their inability to emit all of the light that is generated by their active layer. When an LED is energized, light emitting from its active layer (in all directions) reaches the emitting surfaces at many different angles. Typical semiconductor materials have a high index of refraction ($n \approx 2.2$-$3.8$) compared to ambient air ($n=1.0$) or encapsulating epoxy ($n \approx 1.5$). According to Snell's law, light traveling from a region having a high index of refraction to a region with a low index of refraction that is within a certain critical angle (relative to the surface normal direction) will cross to the lower index region. Light that reaches the surface beyond the critical angle will not cross but will experience total internal reflection (TIR). In the case of an LED, the TIR light can continue to be reflected within the LED until it is absorbed. Because of this phenomenon, much of the light generated by conventional LEDs does not emit, degrading its efficiency.

One method of reducing the percentage of TIR light is to create light scattering centers in the form of random texturing on the LED's surface. The random texturing is patterned into the surface by using sub micron diameter polystyrene spheres on the LED surface as a mask during reactive ion etching. The textured surface has features on the order of the wavelength of light that refract and reflect light in a manner not predicted by Snell's law due to random interference effects. This approach has been shown to improve emission efficiency by 9 to 30%.

As discussed in U.S. Pat. No. 6,821,804, one disadvantage of surface texturing is that it can prevent effective current spreading in LEDs which have a poor electrical conductivity for the textured electrode layer, such as for p-type GaN. In smaller devices or devices with good electrical conductivity, current from the p and n-type layer contacts will spread throughout the respective layers. With larger devices or devices made from materials having poor electrical conductivity, the current cannot spread from the contacts throughout the layer. As a result, part of the active layer will not experience the current and will not emit light. To create uniform current injection across the diode area, a spreading layer of conductive material can be deposited on the surface. However, this spreading layer often needs to be optically transparent so that light can transmit through the layer. When a random surface structure is introduced on the LED surface, an effectively thin and optically transparent current spreader cannot easily be deposited.

Another method of increasing light extraction from an LED is to include a periodic patterning of the emitting surface or internal interfaces which redirects the light from its internally trapped angle to defined modes determined by the shape and period of the surface. See U.S. Pat. No. 5,779,924 to Krames et al. This technique is a special case of a randomly textured surface in which the interference effect is no longer random and the surface couples light into particular modes or directions. One disadvantage of this approach is that the structure can be difficult to manufacture because the surface shape and pattern must be uniform and very small, on the order of a single wavelength of the LED's light. This pattern can also present difficulties in depositing an optically transparent current spreading layer as described above.

An increase in light extraction has also been realized by shaping the LED's emitting surface into a hemisphere with an emitting layer at the center. While this structure increases the amount of emitted light, its fabrication is difficult. U.S. Pat. No. 3,954,534 to Scifres and Burnham discloses a method of forming an array of LEDs with a respective hemisphere above each of the LEDs. The hemispheres are formed in a substrate and a diode array is grown over them. The diode and lens structure is then etched away from the substrate. One disadvantage of this method is that it is limited to formation of the structures at the substrate interface, and the lift off of the structure from the substrate results in increased manufacturing costs. Also, each hemisphere has an emitting layer directly above it, which requires precise manufacturing.

U.S. Pat. No. 5,431,766 discloses photo-electrochemical oxidation and dissolution of silicon (Si) in the absence of water and oxygen. Etch rates and photocurrents in an anhydrous HF-acetonitrile (MeCN) solution are directly proportional to light intensity up to at least 600 mW/cm2, producing a spatially selective etch rate of greater than 4 microns/min. Four electron transfer reactions per silicon molecule occur with a quantum yield greater than 3.3 due to electron injection from high energy reaction intermediates.

U.S. Pat. No. 5,793,062 discloses a structure for enhancing light extraction from an LED by including optically non-absorbing layers to redirect light away from absorbing regions such as contacts, and also to redirect light toward the LED's surface. One disadvantage of this structure is that the non-absorbing layers require the formation of undercut strait angle be difficult to manufacture in many material systems.

U.S. Pat. No. 6,744,071 discloses a nitride semiconductor element having an opposed terminal structure, whose terminals face each other. The nitride semiconductor element includes a conductive layer, a first terminal, a nitride semiconductor with a light-emitting layer, and a second terminal, on a supporting substrate successively. The first terminal and a first insulating protect layer are interposed between the conductive layer and a first conductive type nitride semiconductor layer of the nitride semiconductor.

U.S. Pat. No. 6,821,804 discloses LEDs having light extraction structures on or within the LED to increase its efficiency. The new light extraction structures provide surfaces for reflecting, refracting or scattering light into directions that are more favorable for the light to escape into the package. The structures can be arrays of light extraction elements or disperser layers. The light extraction elements can have many different shapes and are placed in many locations to increase the efficiency of the LED over conventional LEDs. The disperser layers provide scattering centers for light and can be placed in many locations as well.

As further discussed in U.S. Pat. No. 6,821,804, another way to enhance light extraction is to couple photons into surface plasmon modes within a thin film metallic layer on the LED's emitting surface, which are emitted back into radiated modes. These structures rely on the coupling of photons emitted from the semiconductor into surface plasmons in the metallic layer, which are further coupled into photons that are finally extracted. One disadvantage of this device is that it is difficult to manufacture because the periodic structure is a one-dimensional ruled grating with shallow groove depths (<0.1 μm). Also, the overall external quantum efficiencies are low (1.4-1.5%), likely due to inefficiencies of photon to surface plasmon and surface plasmon-to-ambient photon conversion mechanisms. This structure also presents the same difficulties with a current spreading layer, as described above. Light extraction can also be improved by angling the LED chip's side surfaces to create an inverted truncated pyramid. The angled surfaces provide the TIR light trapped in the substrate material with an emitting surface. Using this approach external quantum efficiency has been shown to increase by 35% to 50% for the InGaAlP material system. This approach works for devices in which a significant amount of light is trapped in the substrate. For GaN devices grown on sapphire substrates, much of the light is trapped in the GaN film so that angling the LED chip's side surfaces will not provide the desired enhancement. Still another approach for enhancing light extraction is photon recycling. This method relies on LEDs having a high efficiency active layer that readily converts electrons and holes to light and vice versa. TIR light reflects off the LED's surface and strikes the active layer, where it is converted back to an electron-hole pair. Because of the high efficiency of the active layer, the electron-hole pair will almost immediately be reconverted to light that is again emitted in random directions. A percentage of the recycled light will strike one of the LEDs emitting surfaces within the critical angle and escape. Light that is reflected back to the active layer goes through the same process again.

SUMMARY

Systems and methods are disclosed for fabricating a semiconductor light emitting diode (LED) devices by forming an n-gallium nitride (n-GaN) layer on the LED device, and roughening the surface of the n-GaN layer to enhance light extraction from an interior of the LED device.

Implementations of the above system may include one or more of the following. The n-GaN layer of the LED wafer is roughened by photo-electrochemical oxidation and etching processes. The LED wafer includes a conductive substrate (such as Cu, W, Mo or their alloys); one or more epitaxial layers; one or more ohmic contact and reflective metal layers between the epitaxial layers and the conductive substrate (for example, Ni, Au, Pt, Cr, Ti, Pd, and Ag); a protection layer such as $SiO_2$, $Si_3N_4$, or SiON on the sidewalls of free standing LED; and n-type electrodes on the top n- GaN layer. The photo-electrochemical oxidation and etching process can be performed in a system with an aqueous solution; an illumination system; and an electrical biased system. The aqueous solution can be a combination of oxidizing agent and either acid or alkaline solutions. The oxidizing agent can be one or the combination of $H_2O_2$, $K_2S_2O_8$, among others. The acid solution can be one or more of $H_2SO_4$, HF, HCl, $H_3PO_4$, $HNO_3$, and $CH_3COOH$. The alkaline solution can be one or the mixture of KOH, NaOH, $NH_4OH$, for example. The illumination can be performed by an Hg or Xe arc lamp system with wavelength ranging among visible and ultra-violet spectrum. The illumination is exposed on the n-type III-nitride semiconductors with an intensity less than 200 mW/cm$^2$. An electrical bias can be applied to the conductive substrate and the voltage is controlled between −10 and +10 V. The oxidation-dominant, the etching-dominant or the combined reactions can be controlled to optimize the roughness of the n-GaN surface by varying the constitution of the aqueous solution, the electrical biased, and the illumination intensity. The non-ordered textured morphology also is revealed after the roughening process.

The roughening process can be applied to the exposed n-GaN of the n-GaN up vertical LED at wafer-level. After the GaN-based LED epitaxial film is transferred to a conductive substrate, the n-type electrode (such as Cr/Ni) is formed on the n-type GaN layer. The n-type metal pads not only act as ohmic contacts but also the masks for the subsequent roughening process. The roughening process, which is performed by Photo-electrochemical (PEC) oxidation and etching method, follows the n- electrode metallization. The wafers are immersed into the aqueous solution under illumination and the conductive substrate is electrically biased. The aqueous solution is a combination of oxidizing agents and either acid or alkaline solutes. The roughened surface of n-type GaN would reveal non-ordered textured morphology that is unlike pyramids, cone-shaped, or semi-rounded morphologies. By varying the constitutions of solution, biased voltage, and the illumination intensity, the roughening mechanism can be controlled to oxidation-dominant or etch-dominant reaction. The RMS value of the surface roughness is controlled at 0.05 μm to 2 microns. The roughened surface dimension is selected to optimally scatter light at approximately ½λ. In another implementation, the effective refractive index of the roughened surface is approximately 2.0~2.5.

Advantages of the roughened surface may include one or more of the following. The roughened surfaces create an effective rough surface on GaN to extract more light from interior. Compared with the LEDs with flat surfaces, the luminance of the LEDs with non-ordered textured surfaces can be enhanced by more than two times.

The LEDs can provide more light for the same chip size/power consumption. Alternatively, the LEDs can be made smaller given the same light output requirement and such smaller size consumes less power as well as real estate, resulting in savings. The LEDs can be fabricated with standard processing techniques making them highly cost competitive with standard LEDs.

One embodiment of the present invention is a method. The method generally includes providing a light-emitting diode (LED) wafer assembly, applying a mask to a surface of the n-doped layer, etching the surface of the n-doped layer such that etched pits are formed in the surface, removing the mask, and roughening or texturing the surface of the n-doped layer including the etched pits. The LED wafer assembly generally includes a conductive substrate, a p-doped layer disposed above the conductive substrate, an active layer disposed above the p-doped layer, and an n-doped layer disposed above the active layer.

Another embodiment of the present invention is a method. The method generally includes applying a mask to a surface of a light-emitting diode (LED) wafer, etching the surface of the LED wafer such that etched pits are formed in the surface, removing the mask, and roughening or texturing the surface of the LED wafer including the etched pits.

BRIEF DESCRIPTION OF THE FIGURES

FIG. 1 shows an exemplary system to perform a photoelectrochemical oxidation and etching (PEC) process.

FIGS. 2A-2D show surface profiling diagrams of a first sample with metal masks under oxidation-dominant condition for various durations.

FIGS. 3A-3D show surface profiling diagrams of a second sample with metal masks under etching-dominant condition for various durations.

FIG. 10A illustrates the surface area of the n-doped layer after etching FIG. 9 and in accordance with an embodiment of the invention.

FIG. 10C illustrates the surface area of the n-doped layer after chemical wet etching FIG. 9, thereby forming hexagonal pyramid structures on the surface in accordance with an embodiment of the invention.

FIG. 11 illustrates the surface area of the n-doped layer after roughening the etched surface of FIG. 10A in accordance with an embodiment of the invention.

DESCRIPTION

Figure 3A:
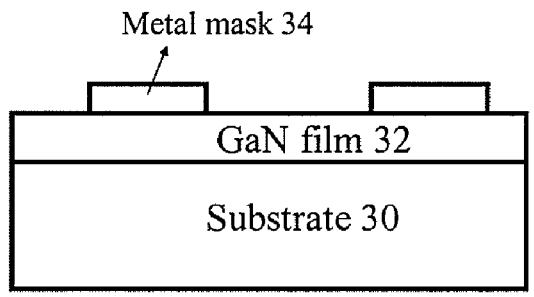

FIG. 1 shows an exemplary system to perform a photo-electrochemical (PEC) oxidation and etching process. The nature of the electrolytic solution is of particular importance in assuring high speed etch rates and in assuring an etch rate which is directly proportional to light intensity. The PEC etching process is carried out in a system shown in FIG. 1. In the system, light is projected by a light source onto the surface of an LED wafer resting above a holder 10 and secured by clamps 12, which is in contact with an electrolytic solution 16. The light intensity may be selectively varied to thereby selectively vary the rate of etching. The cell may have many geometric configurations and may be made of any suitable material for supporting the LED semiconductor wafer and for containing the electrolytic solution 16 having ions. The specific configuration of the cell may be optimized for high volume industrial applications. A reference electrode 14 such as a platinum electrode 14 extends into the electrolytic solution 16 through the cell body. The reference electrode 14 establishes a reference voltage $V_{ref}$ and is usually formed from a metal wire, such as a platinum or silver wire, for convenience, from a saturated calomel electrode (SCE), or from any other electrode mechanism.

The electrochemical reaction occurring in the cell is electrically powered and monitored by a potentiostat, which is well known in the art. The potentiostat comprises a current detector connected in series with a source voltage for applying a potential across the electrodes and a connection, which connects the potentiostat to the semiconductor wafer. The connection may be affixed to the semiconductor wafer via any bonding mechanism.

In the PEC etching process carried out in the system of FIG. 1, the semiconductor wafer is made part of an oxidation-reduction reaction. The semiconductor wafer is made the anode and a counter-electrode is made the cathode. A potential is applied to the semiconductor wafer. The reference electrode 14 is used in the process to measure and monitor the potential. Etching results from a decomposition reaction induced by photogenerated holes at the interface between the semiconductor wafer and the electrolytic solution 16.

FIG. 2A shows surface profiling diagrams of a first sample with metal masks under oxidation-dominant condition for various durations. The sample wafer includes a substrate 30, a GaN film 32 and a metal mask 34 with roughened surfaces. The surface profiling diagrams of a sample with metal masks under oxidation-dominant condition for 200 seconds in FIG. 2B, 400 seconds in FIG. 2C and 600 seconds in FIG. 2D.

FIG. 3 shows surface profiling diagrams of a second sample with metal masks under etching-dominant condition for various durations. The sample wafer includes a substrate 30, a GaN film 32 and a metal mask 34 with roughened surfaces. The surface profiling diagrams of a sample with metal masks under oxidation-dominant condition for 200 seconds in FIG. 3B, 400 seconds in FIG. 3C and 600 seconds in FIG. 3D.

Figure 4:
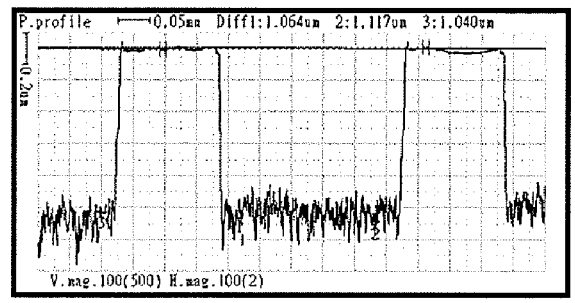
FIG. 4 shows a structure of a vertical light-emitting diode (LED) wafer with top n-GaN layer.
Figure 4:
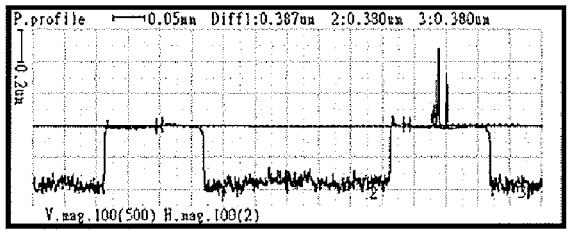
Figure 4:
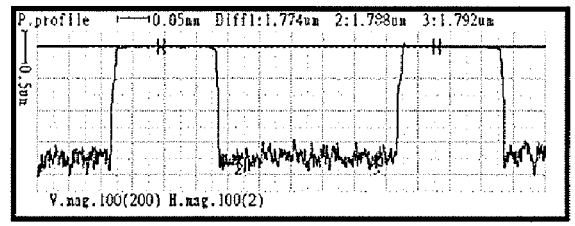
Figure 4:
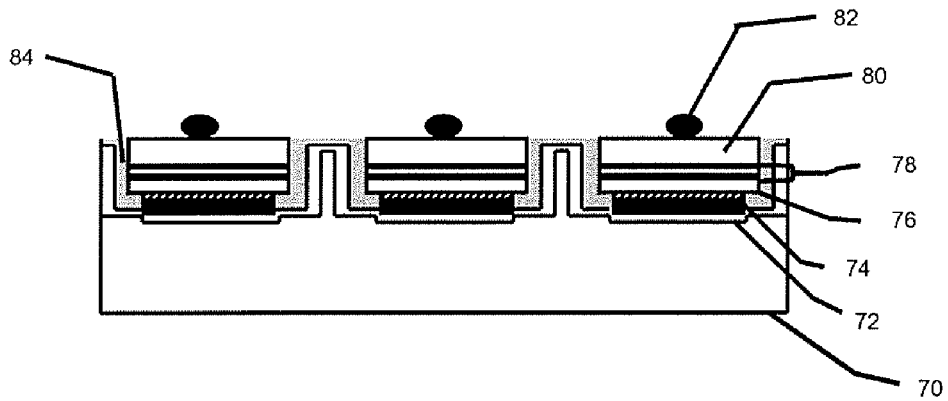

FIG. 4 shows a structure of a vertical-LED wafer. A multi-layer epitaxial structure of an exemplary n-GaN up LED is shown on a metal substrate 70 which can be a thick copper layer in this embodiment. The multi-layer epitaxial structure formed above the metal substrate 70 includes an n-GaN based layer 80, an MQW active layer 78 and a reflector/contact layer 74. The n-GaN based layer 80 has a thickness of 4 microns, for example.

The multi-layer epitaxial layer may be formed by depositing a n-GaN portion (e.g., n-GaN layer 80) above a carrier substrate (not shown), depositing active layers (e.g., MQW active layer 78) above the n-GaN portion, and depositing a p-GaN portion (e.g., p-GaN layer 76) above the active layers, depositing first one or more metal layers (e.g., reflector/contact layer 74), applying a masking layer (not shown), and etching the metal, p-GaN layer, active layers, and n-GaN layer. The masking may then be removed, a passivation layer (e.g., layer 84) deposited, and a portion of the passivation layer on top of the p-GaN removed to expose the first one or more metal layers. Second one or more metal layers (e.g., layer 72) may be deposited, a metal substrate (e.g., metal substrate 70) deposited, the carrier substrate (not shown) removed to expose the n-GaN portion, and the n-GaN portion roughened.

Figure 5:
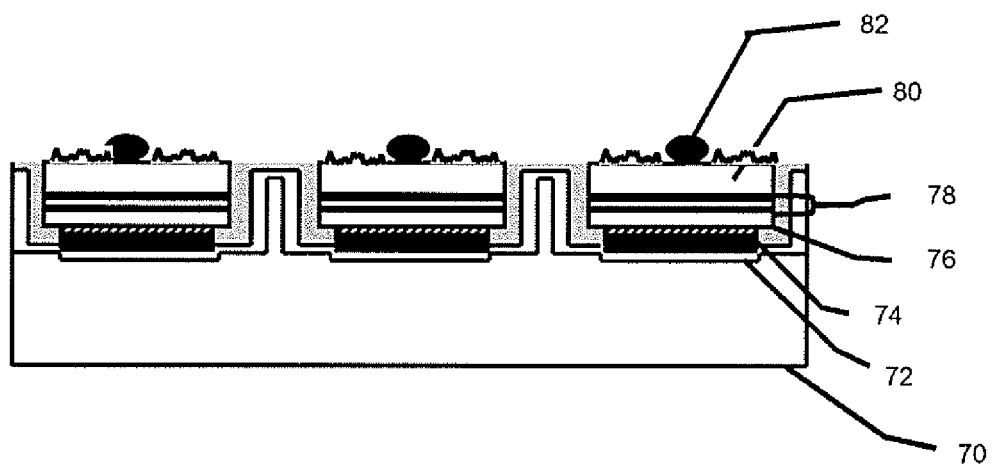
FIG. 5 shows a cross-sectional view of the vertical-LED wafer after the roughening of the exposed n-GaN layer.

The MQW active layer 78 can be an InGaN/GaN MQW active layer. Once electric power is fed between the n-GaN based layer 80 and the contact layer 74, the MQW active layer 78 may be excited and thus generates light. The produced light can have a wavelength between 250 nm to 600 nm. The p-layer 76 can be a p$^+$-GaN based layer, such as a p$^+$-GaN, a p$^+$-InGaN or a p$^+$-AlInGaN layer and the thickness thereof may be between 0.05-0.5 microns. FIG. 5 shows a cross-sectional view of the vertical-LED wafer after the roughening process. As show in FIG. 5-FIG. 6, a non-ordered textured morphology is formed on the n-GaN surface.

Figure 6:
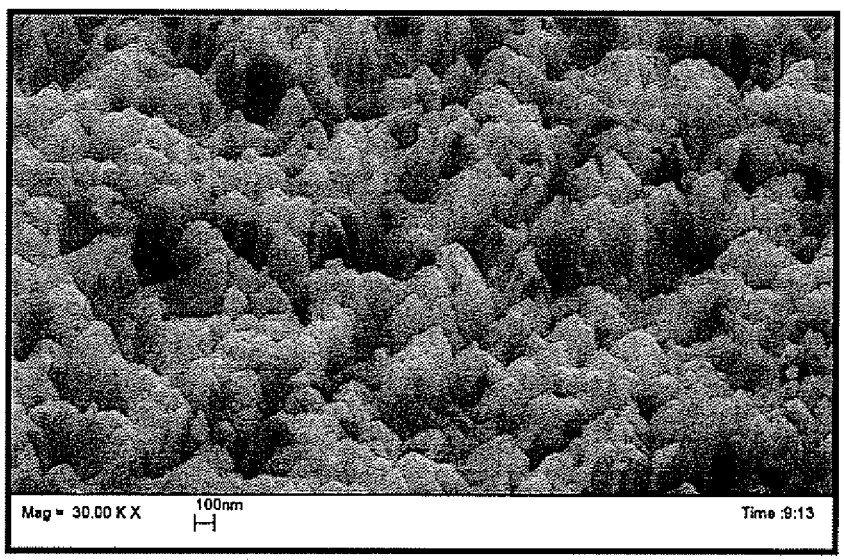
FIG. 6 is an exemplary scanning electron microscope (SEM) graph showing a non-ordered textured morphology of the n-GaN surface.

FIG. 5 shows a cross-sectional view of a roughened surface on the metal layer of the LED of FIG. 4, while FIG. 6 shows an exemplary SEM image of the roughened surface. The variations on the surface effectively roughen the surface, and leads to a better matching of the refractive index to air. As a result, the impressions enable better light extraction from the interior of the LED.

Although the present invention has been described in considerable detail with reference to certain preferred embodiments thereof, other versions are possible. In alternative embodiment, the surface of the GaN layer is roughened using balls/spheres or using wet/dry etching techniques. Other LED configurations utilizing the LEE arrays can also be envisioned by one skilled in the art. The new LED can have different combinations of LEE (light extracting element) arrays and disperser layer. LEEs can have different shapes, sizes, spaces between adjacent LEEs, and can be placed in different locations. Similarly, the disperser layers can be made of different material and placed in different location. Therefore, the spirit and scope of the appended claims should not be limited to the preferred embodiments described above.

ANOTHER EXEMPLARY SURFACE ROUGHENING TECHNIQUE

Embodiments of the present invention provide techniques for increasing the light extraction from light-emitting diodes (LEDs) that may be applied while the LED semiconductor dies are disposed on a wafer or part of a wafer assembly. These techniques may be applied to any LED wafer or wafer assembly comprising multiple dies, and the case of vertical light-emitting diode (VLED) dies is provided as an example. In the figures that follow, only three VLED dies are shown, but this is representative of multiple dies on an LED wafer.

Figure 7A:
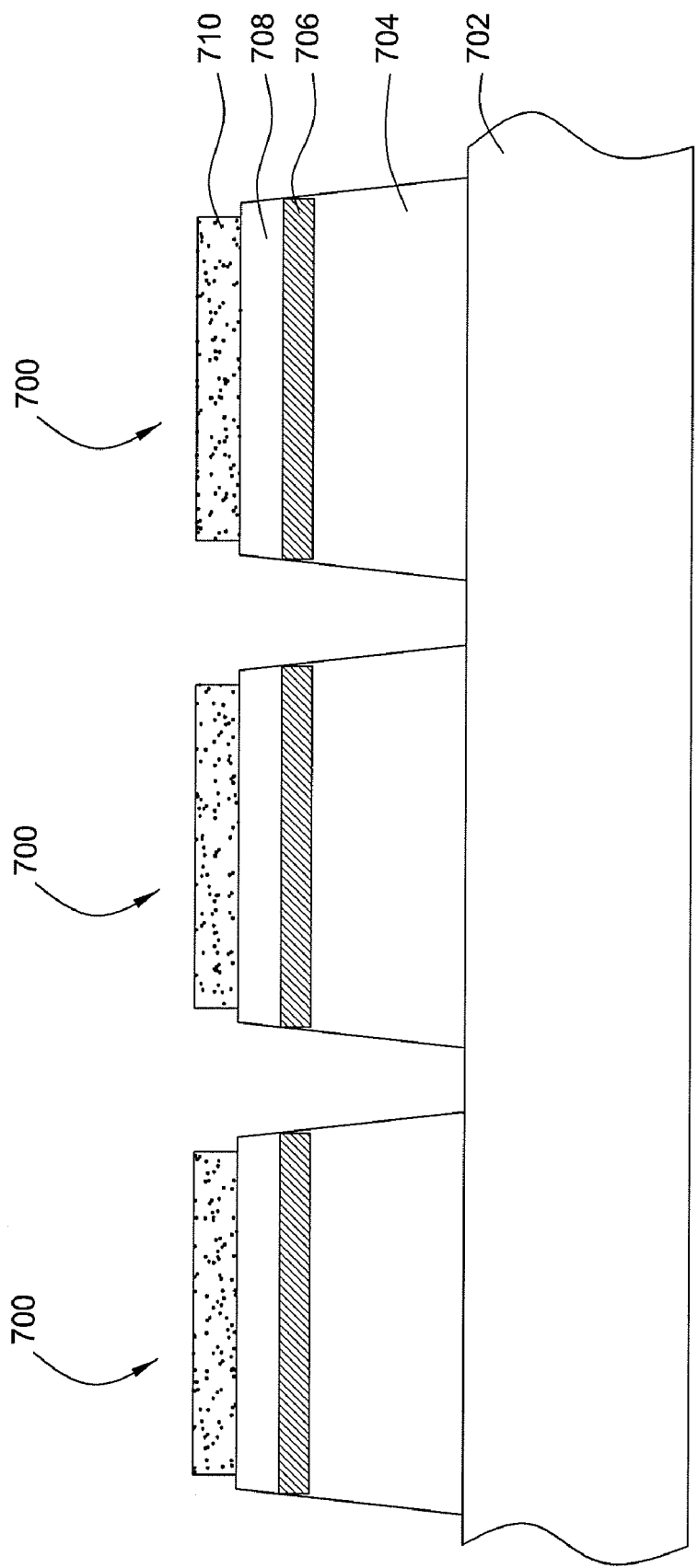
FIGS. 7A-7E illustrate the steps in producing an LED wafer assembly having a conductive substrate before surface roughening in accordance with embodiments of the invention.

Referring now to FIG. 7A, VLED dies 700 may be formed on a carrier substrate 702, such as sapphire, silicon, silicon carbide (SiC), and gallium arsenide (GaAs). The VLED dies 700 may comprise several compound semiconductor epitaxial layers composed of Group III/Group V chemical elements, such as GaN, AlN, InN, and the like. For instance, an n-doped layer 704, such as n-GaN, may be deposited on the carrier substrate 702. An active layer 706 for emitting light may be deposited on the n-doped layer 704, and a p-doped layer 708, such as p-GaN, may be deposited on the active layer 706.

For some embodiments, a reflective layer 710 may be deposited above the p-doped layer 708 to reflect light emitted by the active layer 706 and direct it towards the light-emitting surface of the n-doped layer 704. The reflective layer 710 may comprise any suitable reflective and electrically conductive material, such as Al, Ag, Au, Ni, Pt, Cr, Ti, Pd, Ti/Ag, Ti/Al, Ni/Ag, Ni/Al, Al/Ni/Au, Ag/Ni/Au, and alloys thereof.

Figure 7B:
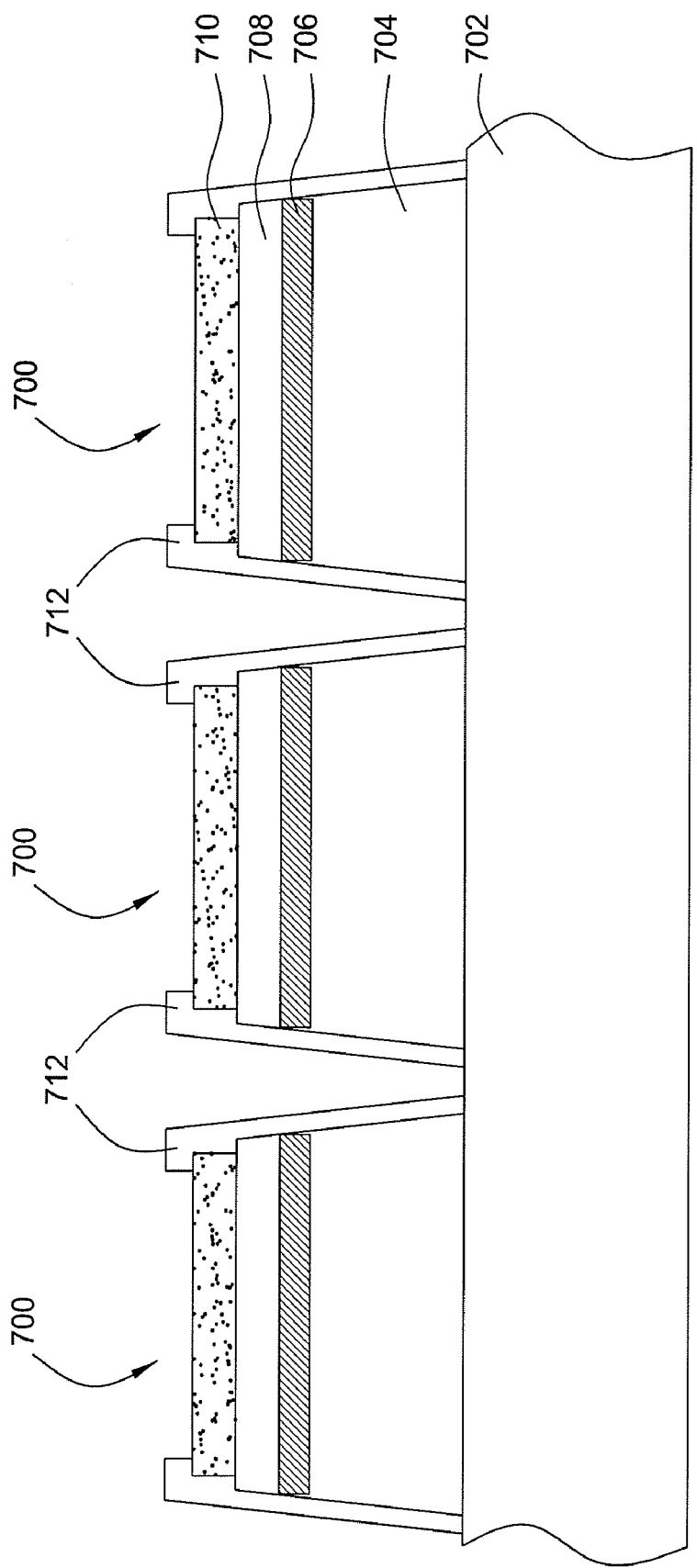

For some embodiments, passivation 712 may be deposited between the VLED dies 700 in order to protect the VLED dies during die separation, for example, as shown in FIG. 7B. The passivation 712 may be a photosensitive or non-photosensitive material, such as a polymer, a polyimide, SU-8, NR-7, AZ5214E, thermoplastic, ZnO, Ta$_2$O$_5$, TiO$_2$, HfO, or MgO.

Figure 7C:
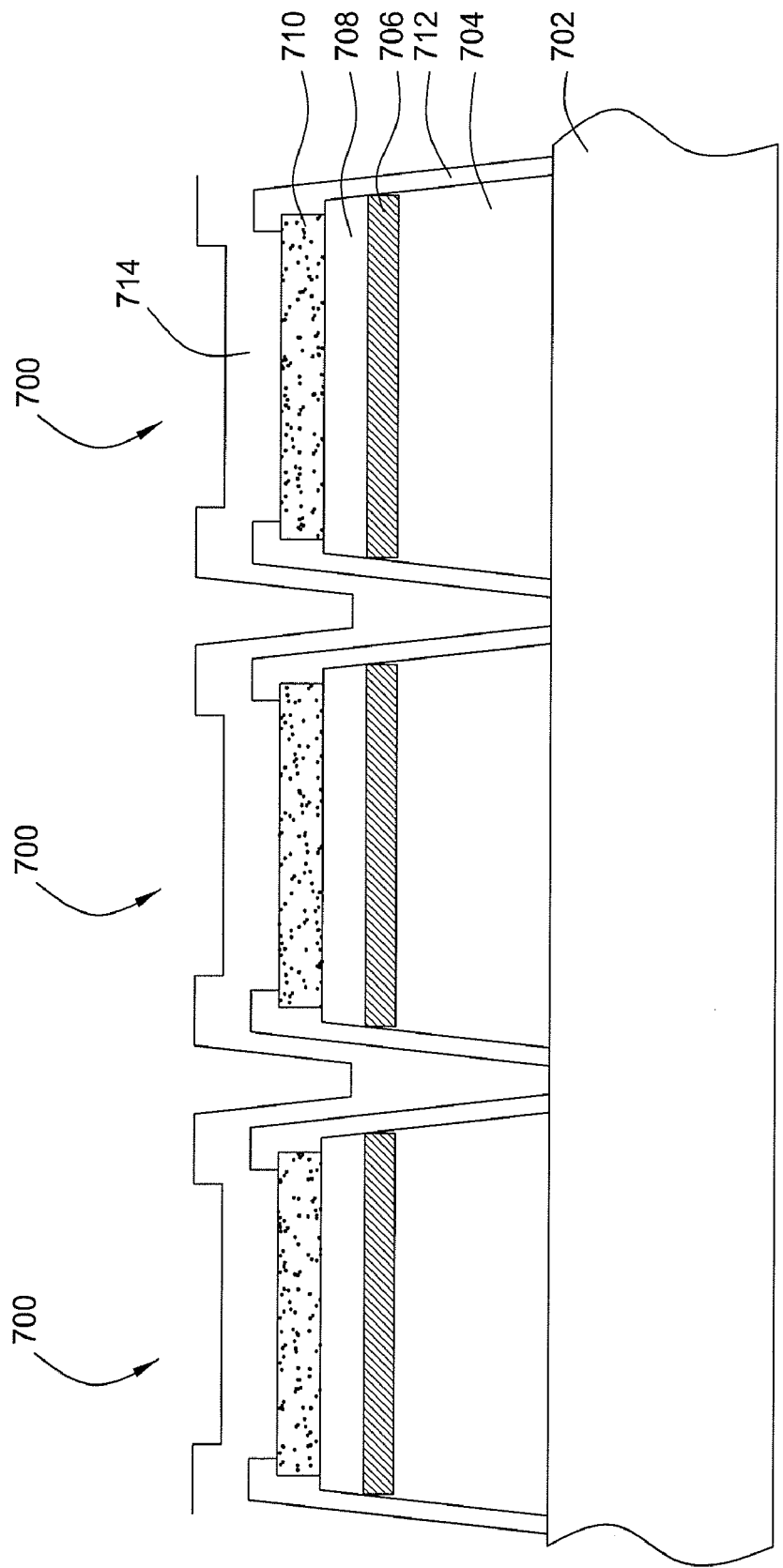
Figure 7D:
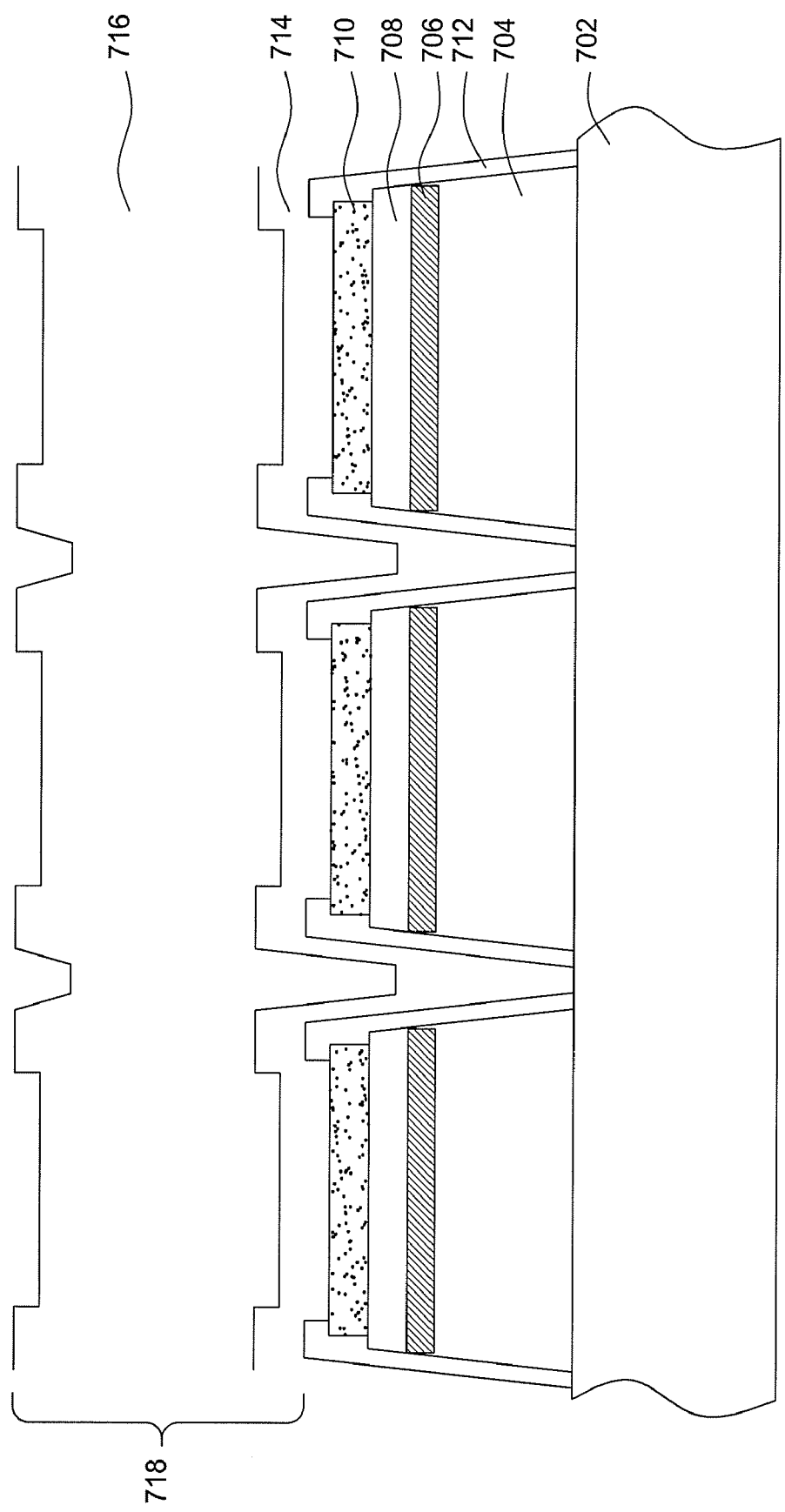

Referring now to FIG. 7C, a seed metal layer 714 may be formed above the VLED dies 700 disposed above the carrier substrate 702. Formed by deposition or electroless plating, the seed metal layer 714 may be composed of any suitable metal or metal alloy, such as Cr/Au, Cr/Au/Ni/Au, Cr/Au/Ti/Ni/Au, Ti/Au, Ti/Ni/Au, Ni/Au, Pt/Au, TaN/Au, or TiN/Au, allowing for the growth of additional metal layers. As depicted in FIG. 7D, electroplating (EP) or electroless plating may be used to grow one or more additional metal layers 716 to form a conductive substrate 718. The conductive substrate 718 may allow for efficient thermal dissipation away from the p-n junction of the VLED dies 700, in addition to electrical conduction. The plated metal layers 716 may comprise any suitable metal or metal alloy, such as Cu, Ni, Ni—Co, Ag, Au, Cu—Co, Cu—Mo, Ni/Cu, Cu/Ni—Co/Cu Cu/Ni—Co/Cu/Ni—Co, or Ni/Cu—Mo. If more than one metal layer 716 is employed, the individual metal layers 716 may comprise different materials. The thickness of the metal layers 716 may typically range from 50 to 200 μm.

Figure 7E:
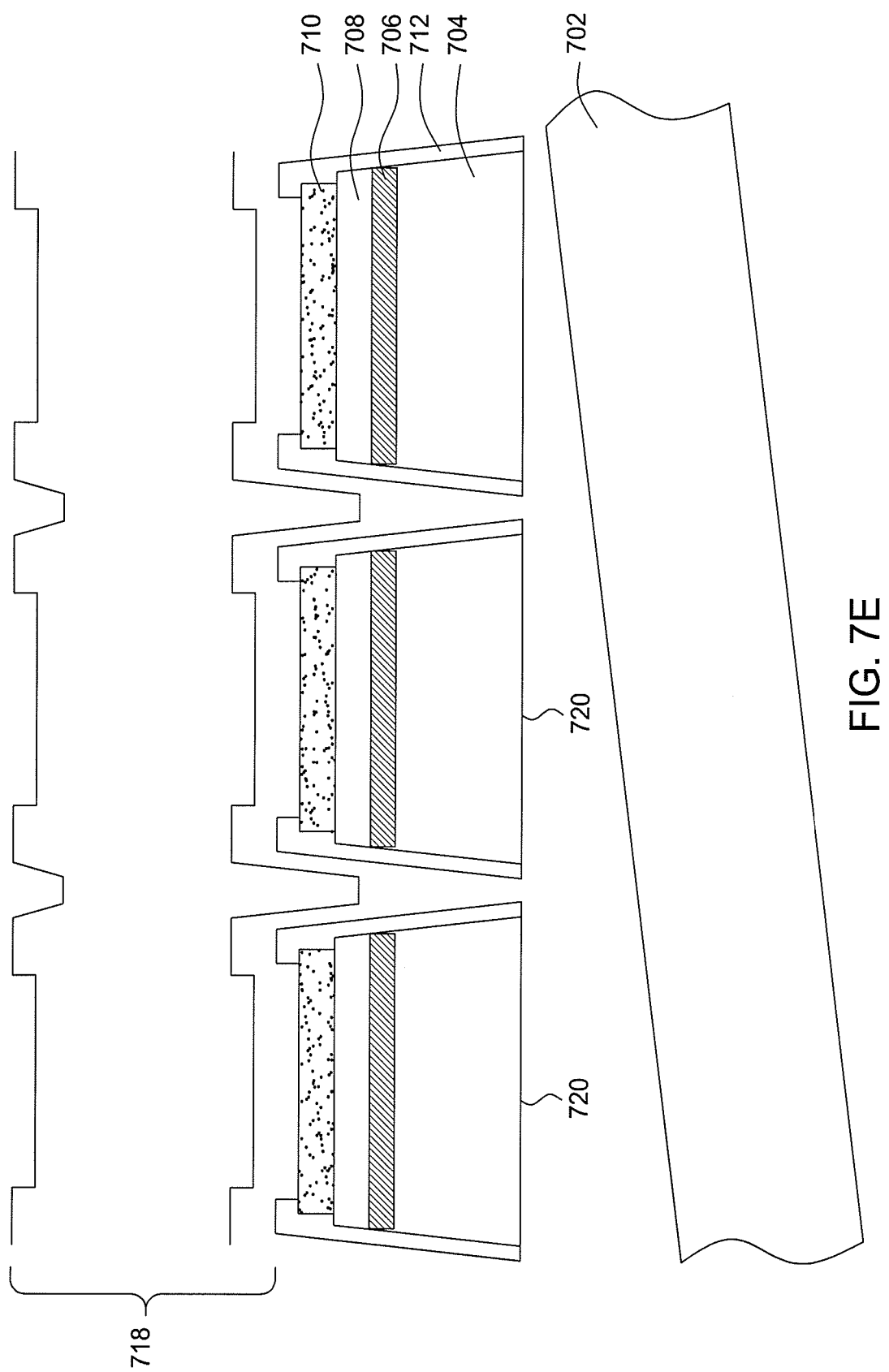

After formation of the conductive substrate 718, the carrier substrate 702 may be removed as illustrated in FIG. 7E to expose a surface 720 of the n-doped layer 704 for the plurality of VLED dies 700. The removal may be accomplished by various suitable techniques, such as laser lift-off, wet etching, photoenhanced wet etching, polishing, and grinding.

Figure 8:
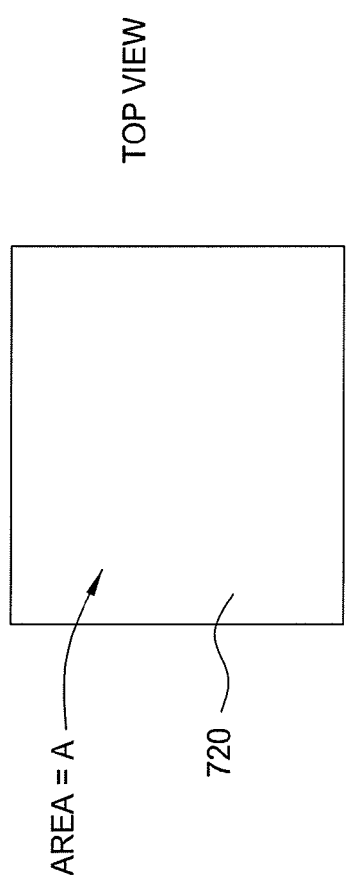
FIG. 8 illustrates the surface area of the n-doped layer before surface roughening and paths for emitted light in accordance with an embodiment of the invention.
Figure 8:
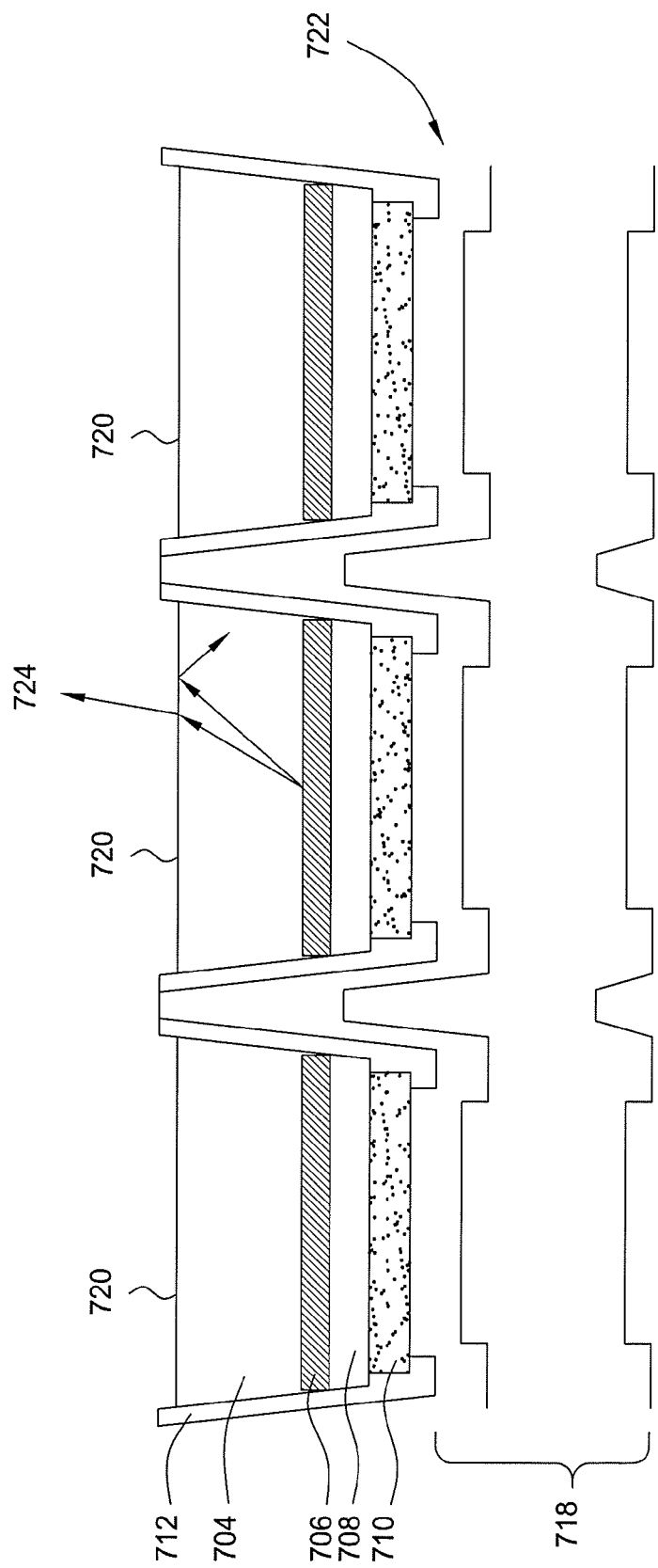

Referring now to FIG. 8, the LED wafer assembly 722 may be inverted for some embodiments to perform additional steps on the surfaces 720 of the n-doped layer 704. At this stage, the surfaces 720 may be substantially flat, and there are most likely not many surface variations to the n-doped layer 704 when the LED wafer assembly 722 is viewed from the top or the side. Although some of the light 724 emitted from the active layer 706 may be emitted from the surface 720 of the n-doped layer at this processing stage, light 724 that reaches the surface 720 beyond the critical angle will most likely not cross and may experience total internal reflection (TIR) according to Snell's law as described above. Additional processing may be desired.

Therefore, as portrayed in FIG. 9, a mask 726 may be applied to the surfaces 720 of the n-doped layer 704, and then the surfaces 720 may be subsequently etched to enhance the surface area of the n-doped layer for increased light extraction from the VLED dies 700. Etching may be accomplished by wet etching, photoenhanced wet etching, dry etching (e.g., inductively coupled plasma/reactive ion etching (ICP/RIE)), or combinations thereof. The composition of the mask 726 may be any suitable material hard enough to withstand repeated etchings, such as Ni, SiO$_2$, Si$_3$N$_4$, or photoresist. The mask 726 may be patterned in any desired manner such that the surface 720 may be selectively etched. For some embodiments, the mask 726 may possess, for example, a grid, checkerboard (as shown), honeycomb, triangular, rectangular, or other shaped polygon pattern. For some embodiments, different sizes of a desired polygon or different polygons may be combined to pattern the mask 726.

After the surfaces 720 of the n-doped layer 704 have been etched, the mask 726 may be removed leaving the wafer assembly as shown in FIG. 10A. The surfaces 720 may have several etched pits 728 where material was removed, leaving several teeth 730 to form a comb-like surface in a two-dimensional cross section as shown. The checkerboard pattern of etched pits 728 and teeth 730 for the surfaces 720 is illustrated in the top view of FIG. 10A. These features may enhance the light emission rate since the surface area (B) created by the etched pits 728 and teeth 730 is greater than the surface area (A) of the n-doped layer 704 in FIG. 8. Hence, more light 724 may be extracted from the surface according to Snell's law and TIR theory at this processing stage.

Figure 10B:
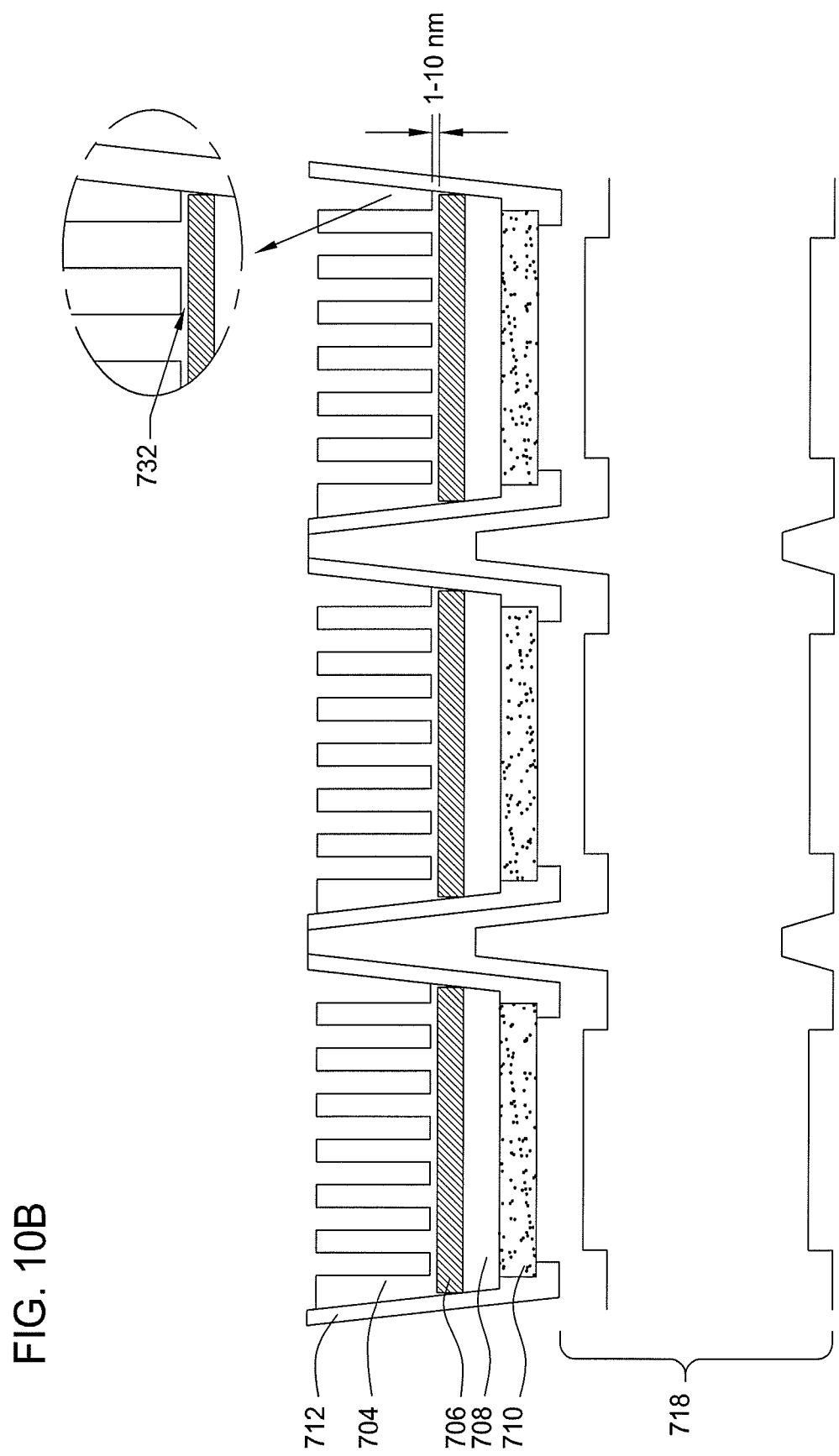
FIG. 10B illustrates surface excitation enhancement after etching FIG. 9 substantially through the n-doped layer to approach the active layer in accordance with an embodiment of the invention.

For some embodiments as illustrated in FIG. 10B, the n-doped layer 704 may be etched nearly all the way through so that the depth of the etched pits 728 may approach the active layer 706 within 1 to 10 nm. The resulting surface excitation features (SEFs) 732 may increase the density of states and the spontaneous emission rate in the LED semiconductor. The SEFs 732 may also lead to the enhancement of SEF/quantum-well coupling. Thereby, the light extraction may be further enhanced.

Figure 9:
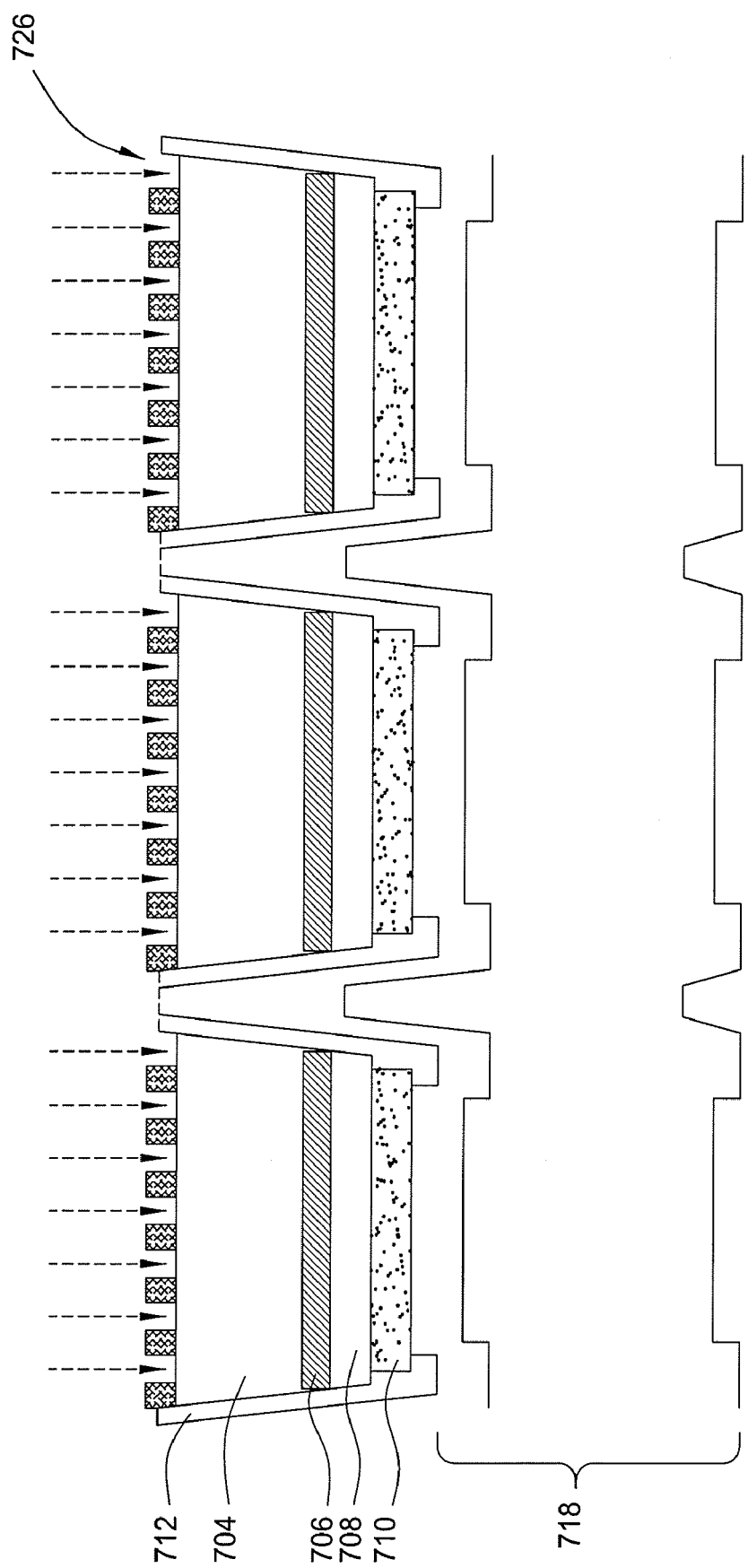
FIG. 9 illustrates applying a mask to and etching the surface of the n-doped layer in FIG. 8 in accordance with embodiments of the invention.

For other embodiments employing the mask 726 of FIG. 9, the surfaces 720 may be etched using chemical wet etching. Due to the crystallographic structure of many compound semiconductor materials used in LED fabrication, such as GaN, hexagonal pyramid structures may be formed in the n-doped layer 704 as shown in FIG. 10C. The wet etching and, hence, the dimensions of the hexagonal pyramid structures may be well-controlled.

Figure 10D:
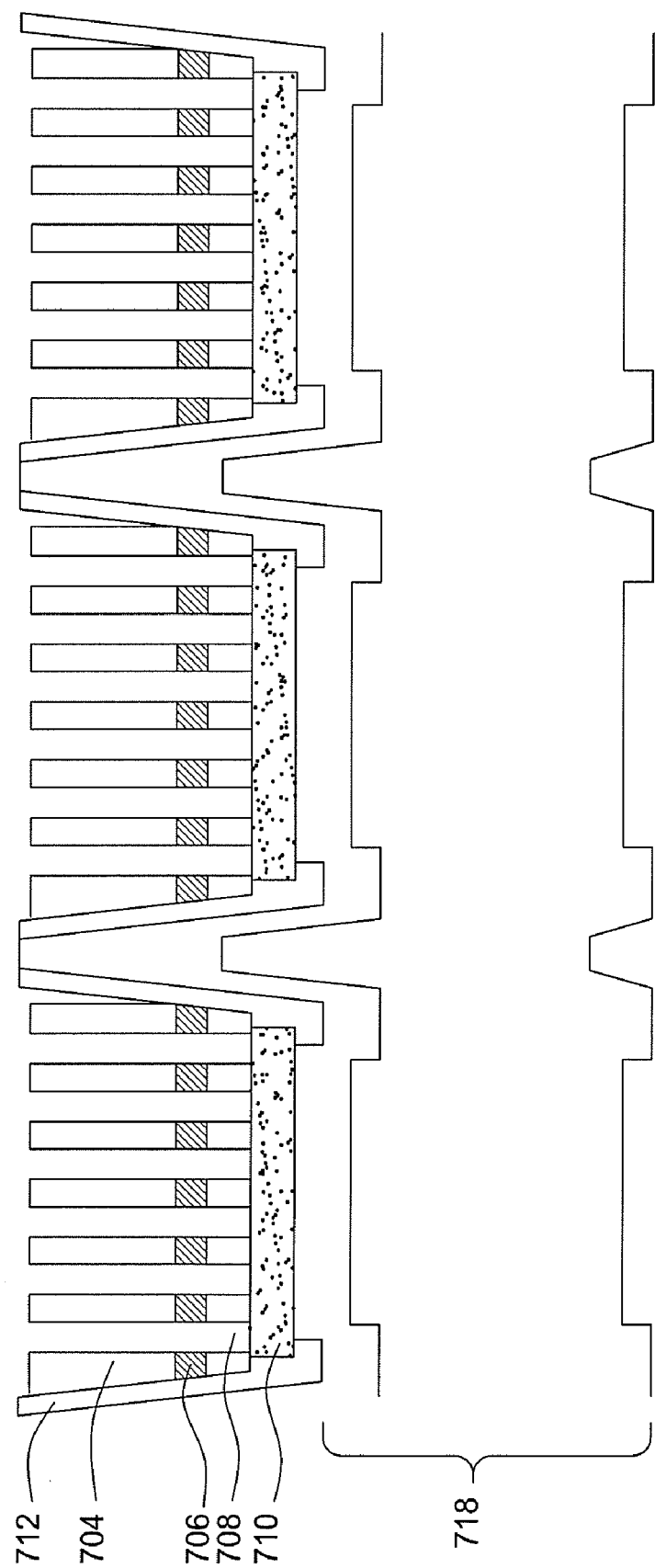
FIG. 10D illustrates the LED wafer assembly after etching FIG. 9 through the n-doped layer, the active layer, and the p-doped layer in accordance with an embodiment of the invention.

Referring now to FIG. 10D, the LED wafer assembly having the mask 726 as shown in FIG. 9 may be etched completely through the n-doped layer 704, the active layer 706, and the p-doped layer 708 for some embodiments. In this manner, micro-disk or micro-ring VLED structures may be formed. By controlling the size and periodicity of the mask 726, a nanoscale structure, such as a nanorod VLED, may be created. The micro-disk, micro-ring, and nanorod VLED structures all have enhanced surface area when compared to the surfaces 720 of the n-doped layer 704 in FIG. 8, and thus, these structures may provide increased light extraction over conventional VLED structures. For some embodiments where the n-doped layer 704 is completely etched through, the active layer 706 may be partially or completely etched through. If the active layer 706 is completely etched through, the p-doped layer 708 may be partially or completely etched through for some embodiments.

Referring now to FIG. 11, the surfaces 720 of the n-doped layer 704 shown in the top view and cross-sectional views of FIG. 10A (or other embodiments described above) may be roughened or textured to increase the surface area and, thereby, the light extraction still further. For some embodiments, the surfaces 720 having the patterned etched pits 728 may be roughened by any suitable technique including wet etching, photoenhanced wet etching, dry etching, or photoelectrochemical (PEC) oxidation and etching as described above. For other embodiments, the surface area of the n-doped layer 704 may be increased by applying submicron-dimensioned objects, such as polystyrene spheres, to the surface 720 of the n-doped layer including the surfaces of the etched pits 728.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method comprising:
   providing a light-emitting diode (LED) wafer assembly, comprising:
   a conductive substrate;
   a p-doped layer disposed above the conductive substrate;
   an active layer disposed above the p-doped layer;
   an n-doped layer disposed above the active layer;
   applying a mask to a surface of the n-doped layer;
   etching the surface of the n-doped layer such that etched pits are formed in the surface;
   removing the mask; and
   roughening or texturing the surface of the n-doped layer including the etched pits, wherein roughening or texturing the surface of the n-doped layer comprises at least one of wet etching, photoenhanced wet etching, dry etching, and applying objects to the surface including the etched pits.

2. The method of claim 1, wherein the mask comprises at least one of Ni, $SiO_2$, $Si_3N_4$, and photoresist.

3. The method of claim 1, wherein the mask has a checkerboard or honeycomb pattern.

4. The method of claim 1, wherein etching the surface comprises at least one of wet etching, photoenhanced wet etching, and dry etching.

5. The method of claim 1, wherein etching the surface of the n-doped layer comprises etching the n-doped layer within 1 to 10 nm of the active layer.

6. The method of claim 1, wherein etching the surface of the n-doped layer comprises etching completely through at least a portion of the n-doped layer and etching at least partially through at least a portion of the active layer.

7. The method of claim 1, wherein etching the surface of the n-doped layer comprises etching completely through at least portions of the n-doped layer and the active layer and at least partially through the p-doped layer.

8. The method of claim 1, wherein the conductive substrate comprises a single layer or multiple layers of at least one of Cu, Ni, Ni—Co, Ag, Au, Cu—Co, Cu—Mo, Ni/Cu, Cu/Ni—Co/Cu, Cu/Ni—Co/Cu/Ni—Co, and Ni/Cu—Mo.

9. The method of claim 1, wherein the LED wafer assembly comprises a reflective layer disposed between the conductive substrate and the p-doped layer.

10. The method of claim 9, wherein the reflective layer comprises at least one of Al, Ag, Au, Ni, Pt, Cr, Ti, Pd, Ti/Ag, Ti/Al, Ni/Ag, Ni/Al, Al/Ni/Au, Ag/Ni/Au, and alloys thereof.

11. A method of claim 1, wherein roughening the surface of the n-doped layer comprises:
   immersing the surface of the n-doped layer including the etched pits in an electrolytic solution;
   applying an electrical bias to the conductive substrate; and
   illuminating the surface such that photoelectrochemical (PEC) oxidation and etching occurs to roughen the surface of the n-doped layer including surfaces of the etched pits.

12. The method of claim 11, further comprising forming conductive contacts on the n-doped layer, wherein the conductive contacts act as a mask during the PEC oxidation and etching.

13. The method of claim 11, wherein the electrolytic solution can be a combination of an oxidizing agent and either an acid or an alkaline solution.

14. The method of claim 13, wherein the oxidizing agent comprises at least one of $H_2O_2$ and $K_2S_2O_8$.

15. The method of claim 13, wherein the acid solution comprises at least one of $H_2SO_4$, HF, HCl, $H_3PO_4$, $HNO_3$, and $CH_3COOH$.

16. The method of claim 13, wherein the alkaline solution comprises KOH, NaOH, $NH_4OH$, or combinations thereof.

17. The method of claim 11, wherein the electrical bias ranges from −10 V to +10 V.

18. A method comprising:
   applying a mask to a surface of a light-emitting diode (LED) wafer;
   etching the surface of the LED wafer such that etched pits are formed in the surface;

removing the mask; and roughening or texturing the surface of the LED wafer including the etched pits, wherein roughening or texturing the surface of the LED wafer comprises at least one of wet etching, photoenhanced wet etching, dry etching, and applying objects to the surface including the etched pits.

19. The method of claim 18, wherein the mask comprises at least one of Ni, $SiO_2$, $Si_3N_4$, and photoresist.

20. The method of claim 18, wherein etching the surface of the LED wafer comprises at least one of wet etching, photoenhanced wet etching, and dry etching.

* * * * *